United States Patent
Liang

(10) Patent No.: US 8,552,769 B2
(45) Date of Patent: Oct. 8, 2013

(54) SEMICONDUCTOR DEVICE

(75) Inventor: Xiaoguang Liang, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/484,766

(22) Filed: May 31, 2012

(65) Prior Publication Data

US 2013/0088266 A1 Apr. 11, 2013

(30) Foreign Application Priority Data

Oct. 5, 2011 (JP) .................. 2011-221157

(51) Int. Cl.
*H03B 1/00* (2006.01)
(52) U.S. Cl.
USPC .......................................... 327/112; 327/108
(58) Field of Classification Search
USPC .................................. 327/108–112
See application file for complete search history.

(56) References Cited

U.S. PATENT DOCUMENTS 7,268,596 B2 * 9/2007 Ota et al. ...................... 327/112
7,893,733 B1 * 2/2011 Tan ............................... 327/108

FOREIGN PATENT DOCUMENTS

JP 2010-178579 8/2010

OTHER PUBLICATIONS

U.S. Appl. No. 13/456,510, filed Apr. 26, 2012, Liang.

* cited by examiner

*Primary Examiner* — Hai L Nguyen
(74) *Attorney, Agent, or Firm* — Oblon, Spivak, McClelland, Maier & Neustadt, L.L.P.

(57) ABSTRACT

A semiconductor device includes first and second power elements and first and second driving circuits. The semiconductor device also includes a resistor having a first end connected to the first power element and a second end connected to the first driving circuit. Furthermore, the semiconductor device includes a switching element connected between the first driving circuit and the first end of the resistor, and turned ON and OFF. When a first input signal is an OFF signal, the first driving circuit causes the first power element to become turned OFF, and when the first input signal is an OFF signal or when a second input signal is an ON signal, the switching element is turned ON.

4 Claims, 6 Drawing Sheets

SEMICONDUCTOR DEVICE

BACKGROUND OF THE INVENTION

1. Field of the Invention

The present invention relates to a semiconductor device which can prevent miss-operation by a simple circuit configuration.

2. Background Art

For the power control of the load of a motor and the like, a semiconductor device such as a bridge circuit or a three-phase AC inverter circuit is used. Such a semiconductor device has two power elements totem-pole-connected between a power source potential and a grounding potential, and a driving circuit to drive them. The midpoint of the two power elements is connected to the load, and controls the load by the ON-OFF controlling of the two power elements (for example, refer to Japanese Patent Application Laid-Open No. 2010-178579 (Patent Literature 1).

FIG. 12 is a circuit diagram showing a conventional semiconductor device. When a power element Q1 is turned ON, dV/dt is applied between the collector and the emitter of a power element Q2. In this case, since a current to charge the parasitic capacity Cres between the gate and the collector of the power element Q2 flows, the gate voltage of the power element Q2 rises (gate float). When the gate voltage of the power element Q2 by this gate float exceeds the threshold voltage, the power element Q2 is faultily turned ON, and a short-circuit current flows.

Therefore, when the power element Q2 is turned OFF, a negative voltage V− is applied to the gate of the power element Q2 using the power source for a negative voltage. Thereby, since the gate voltage of the power element Q2 becomes lower than the emitter voltage (GND), the gate voltage of the power element Q2 is hard to rise to the threshold voltage even if gate float occurs.

SUMMARY OF THE INVENTION

Conventional semiconductor devices requires a plurality of power sources, and has problems wherein circuit constitutions become complicated.

In view of the above-described problems, an object of the present invention is to provide a semiconductor device which can prevent miss-operation by a simple circuit.

According to the present invention, a semiconductor device includes: a first power element having a control terminal, a first terminal, and a second terminal; a second power element totem-pole-connected to the first power element; a first driving circuit having a high-voltage terminal connected to a power sauce, and a low-voltage terminal, and driving the first power element corresponding to a first input signal; a second driving circuit driving the second power element corresponding to a second input signal; a resistor having a first end connected to the second terminal of the first power element and a second end connected to the low-voltage terminal of the first driving circuit; and a switching element connected between the high-voltage terminal of the first driving circuit and the first end of the resistor, and turned ON and OFF corresponding to the first input signal or the second input signal. When the first input signal is an OFF signal, the first driving circuit supplies a voltage of the low-voltage terminal to the control terminal of the first power element and the first power element is turned OFF. When the first input signal is an OFF signal or when the second input signal is an ON signal, the switching element is turned ON.

The present invention makes it possible to prevent miss-operation by a simple circuit.

Other and further objects, features and advantages of the invention will appear more fully from the following description.

DETAILED DESCRIPTION OF THE PREFERRED EMBODIMENTS

A semiconductor device according to the embodiments of the present invention will be described with reference to the drawings. The same components will be denoted by the same symbols, and the repeated description thereof may be omitted.

First Embodiment

Figure 1:
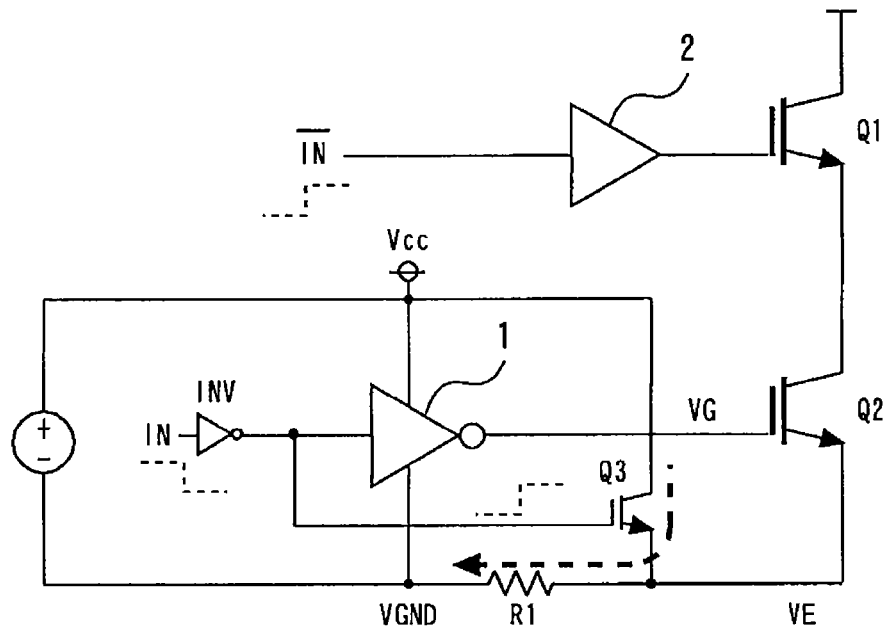
FIG. 1 is a circuit diagram showing a semiconductor device according to the first embodiment of the present invention.

FIG. 1 is a circuit diagram showing a semiconductor device according to the first embodiment of the present invention. Between the power source potential and the grounding potential, a power element Q1 and a power element Q2 are totem-pole-connected. A driving circuit 1 drives the power element Q2 corresponding to input signals IN, and a driving circuit 2 drives the power element Q1 corresponding to input signals /IN.

The driving circuit 1 has a high-voltage terminal connected to the power sauce, and a grounded low-voltage terminal. An inverter INV reverses and outputs input signals IN, and the driving circuit 1 reverses and amplifies the output signals, and supplies them to the gate of the power element Q2.

An end of a resistor R1 is connected to the emitter of the power element Q2, and the other end of the resistor R1 is connected to the low-voltage terminal of the driving circuit 1. A switching element Q3 is connected between the high-voltage terminal of the driving circuit 1 and an end of the resistor R1. The output signals of the inverter INV are supplied to the gate of the switching element Q3, and the switching element Q3 is turned ON and OFF corresponding to the input signals IN.

Figure 2:
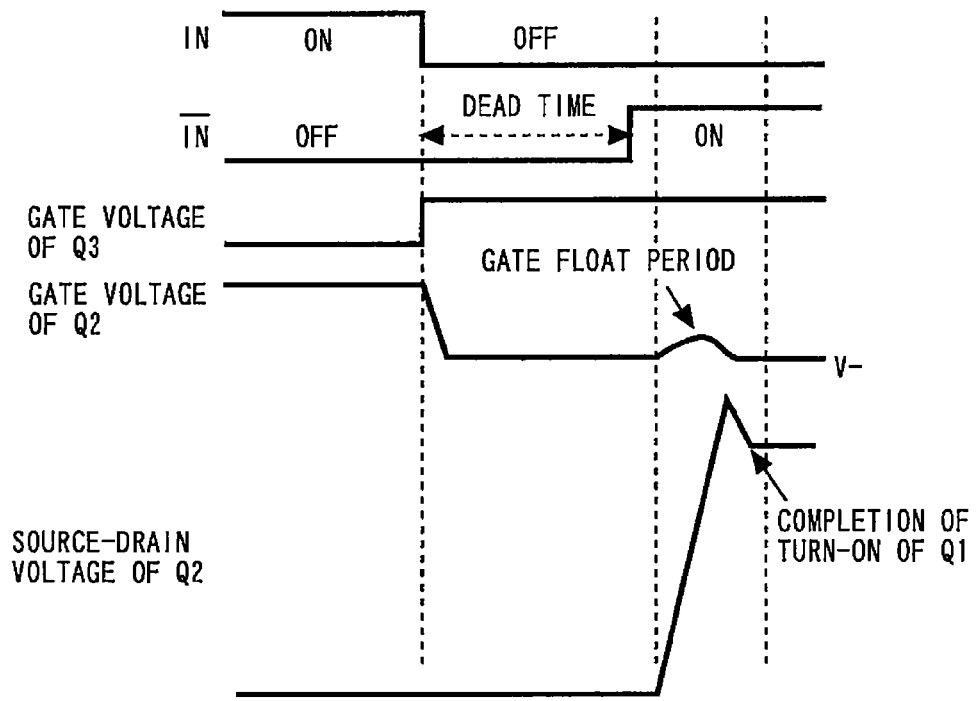
FIG. 2 is a timing chart showing the operations of the semiconductor device shown in FIG. 1.

FIG. 2 is a timing chart showing the operations of the semiconductor device shown in FIG. 1. With reference to the timing chart, the operation of the semiconductor device shown in FIG. 1 will be described. Although the input signals /IN are the reversed input signals IN, there is a dead time between the both.

When the input signals IN are OFF signals, the driving circuit 1 supplies the voltage VGND of the low-voltage terminal to the gate of the power element Q2, and the power element Q2 is turned OFF. In this case, since the input signals /IN become ON signals, the driving circuit 2 supplies a high voltage to the gate of the power element Q1, and the power element Q1 is turned ON.

On the other hand, when the input signals IN are ON signals, the driving circuit 1 supplies the voltage of the high-voltage terminal to the gate of the power element Q2, and the power element Q2 is turned ON. In this case, since the input signals /IN become OFF signals, the driving circuit 2 supplies a low voltage to the gate of the power element Q1, and the power element Q1 is turned OFF.

When the input signals IN are OFF signals, the switching element Q3 is turned ON, and a current flows in the resistor R1. Thereby, the voltage VGND of the low-voltage terminal of the driving circuit 1 is lowered by the voltage lowering of the resistor R1 than the emitter voltage VE of the power element Q2. Therefore, since the gate voltage VG when the power element Q2 is turned OFF is a negative voltage relative to the emitter voltage VE, even if gate float occurs, the gate voltage of the power element Q2 becomes hard to rise to the threshold voltage. Thereby, miss-operation can be prevented by a simple circuit configuration that requires no power source for a negative voltage.

Second Embodiment

Figure 3:
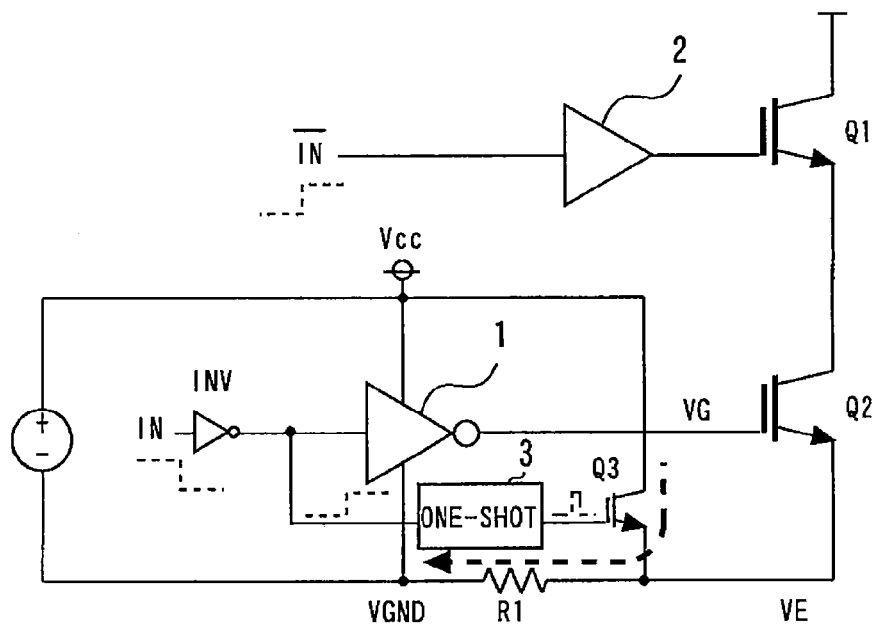
FIG. 3 is a circuit diagram showing a semiconductor device according to the second embodiment of the present invention.

FIG. 3 is a circuit diagram showing a semiconductor device according to the second embodiment of the present invention. A one-shot circuit 3 supplies pulse signals to the gate of the switching element Q3 when the input signals IN are turned OFF.

Figure 4:
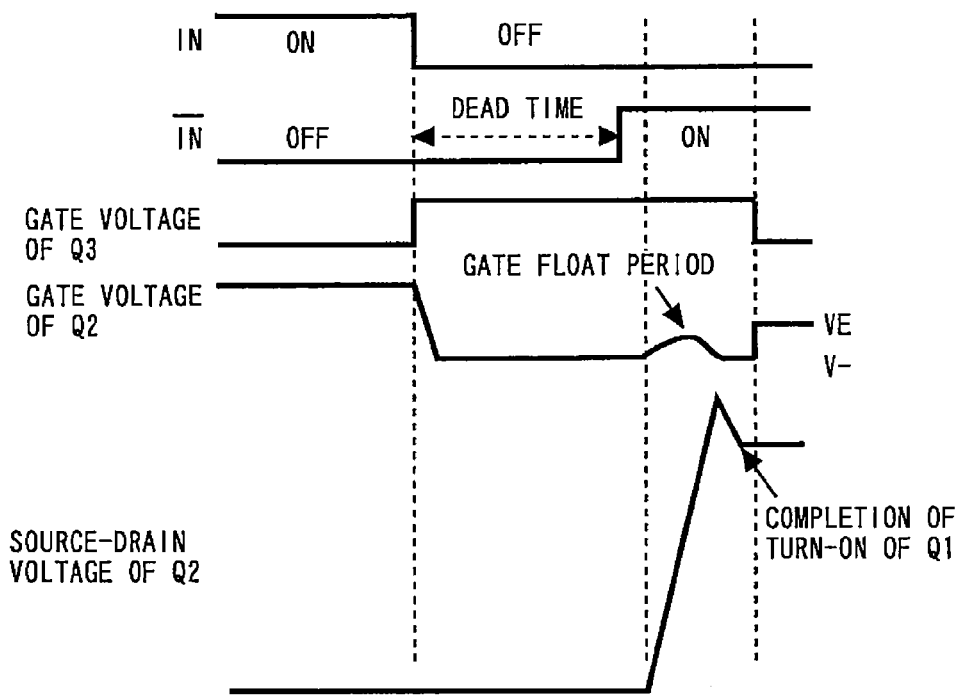
FIG. 4 is a timing chart showing the operation of the semiconductor device according to FIG. 3.

FIG. 4 is a timing chart showing the operation of the semiconductor device according to FIG. 3. The switching element Q3 is turned ON for only a determined time until the completion of the turn-ON of the power element Q1 by the pulse signals from the one-shot circuit 3. Therefore, since the ON period of the switching element Q3 is shortened in comparison with the first embodiment, the power consumption of the power source can be reduced.

Third Embodiment

Figure 5:
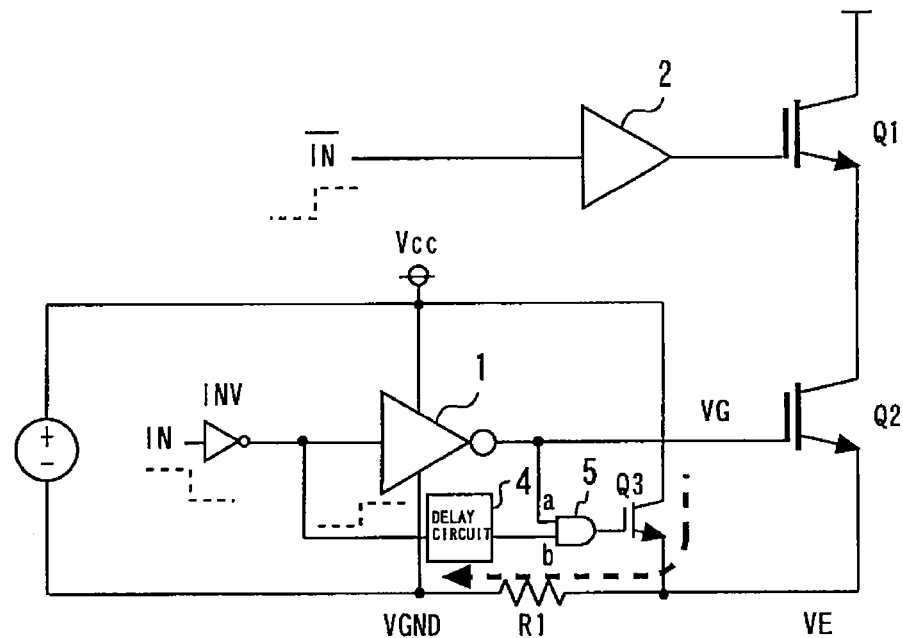
FIG. 5 is a circuit diagram showing a semiconductor device according to the third embodiment of the present invention.

FIG. 5 is a circuit diagram showing a semiconductor device according to the third embodiment of the present invention. A delay circuit 4 delays the output signals of the inverter INV. The voltage of the gate of the power element Q2 is inputted into the a-terminal, and the output voltage of the delay circuit 4 is inputted to the b-terminal of the AND circuit 5, respectively. The switching element Q3 is turned ON or OFF depending upon the output signals of the AND circuit 5.

Figure 6:
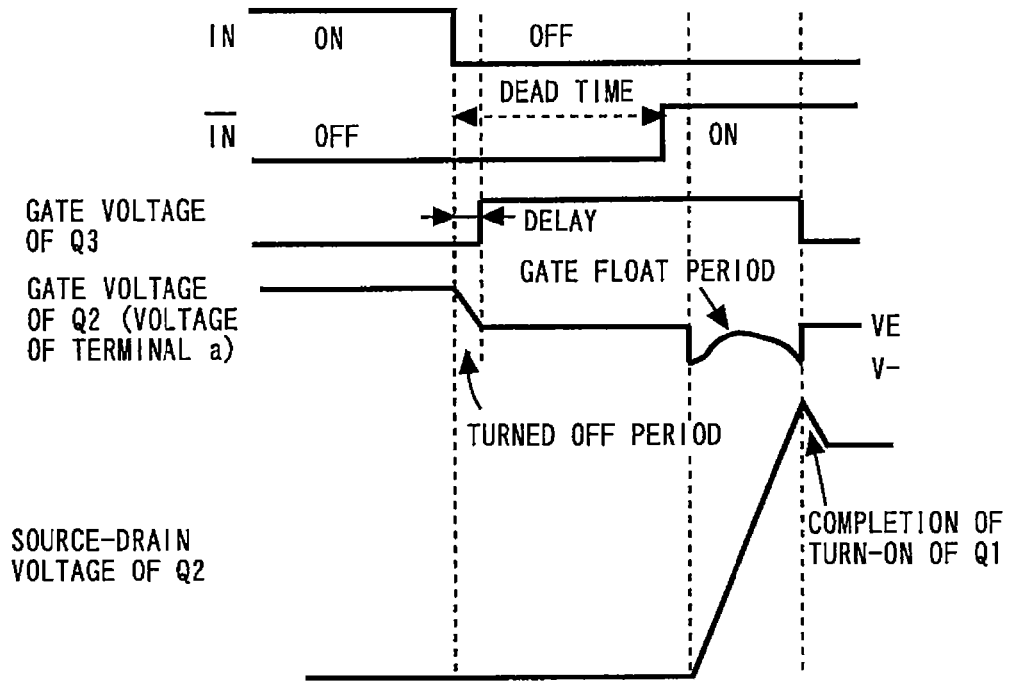
FIG. 6 is a timing chart showing the operation of the semiconductor device according to FIG. 5.

FIG. 6 is a timing chart showing the operation of the semiconductor device according to FIG. 5. The AND circuit 5 turns the switching element Q3 ON only when the input signals IN are OFF signals, and the voltage of the gate of the power element Q2 becomes higher than the voltage VGND of the low-voltage terminal (gate float period). Thereby, since the ON period of the switching element Q3 is further shortened, the power consumption of the power source can be significantly reduced. The protection period is widened.

Furthermore, in the period wherein the power element Q2 is turned OFF, the voltage of the gate of the power element Q2 becomes high. Therefore, the delay circuit 4 is instituted so as not to perform protecting operations during the turn-off period of the power element Q2.

Fourth Embodiment

Figure 7:
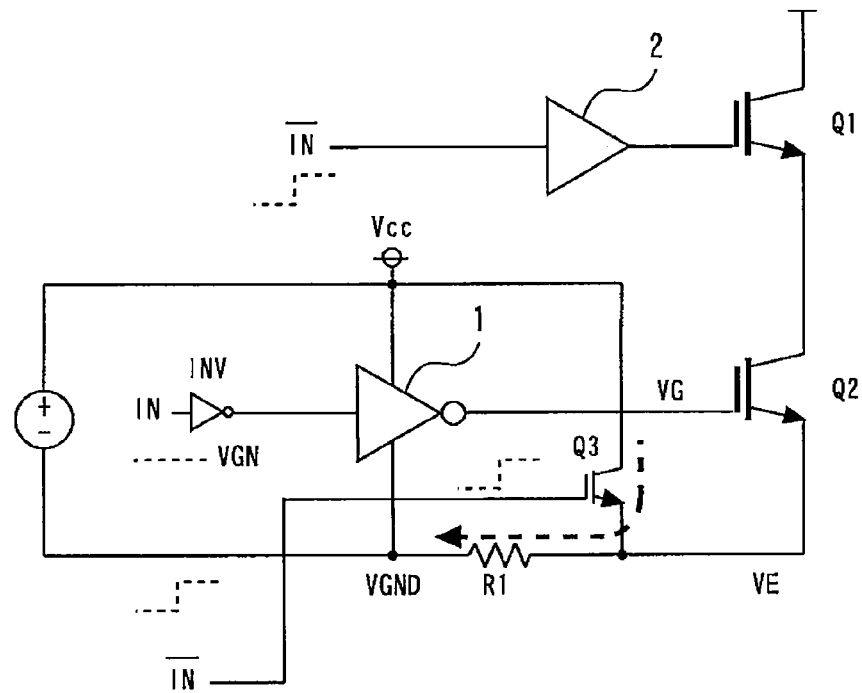
FIG. 7 is a circuit diagram showing a semiconductor device according to the fourth embodiment of the present invention.

FIG. 7 is a circuit diagram showing a semiconductor device according to the fourth embodiment of the present invention. Different from the first embodiment, input signals /IN are supplied to the gate of the switching element Q3, and the switching element Q3 is turned ON or OFF according to the input signals /IN. The switching element Q3 is turned ON when the input signals are ON signals. Thereby, since the switching element Q3 is not turned ON during the dead time, the power consumption of the power source can be reduced in comparison with the first embodiment. Otherwise, the effects identical to the effect of first embodiment can be obtained.

Fifth Embodiment

Figure 8:
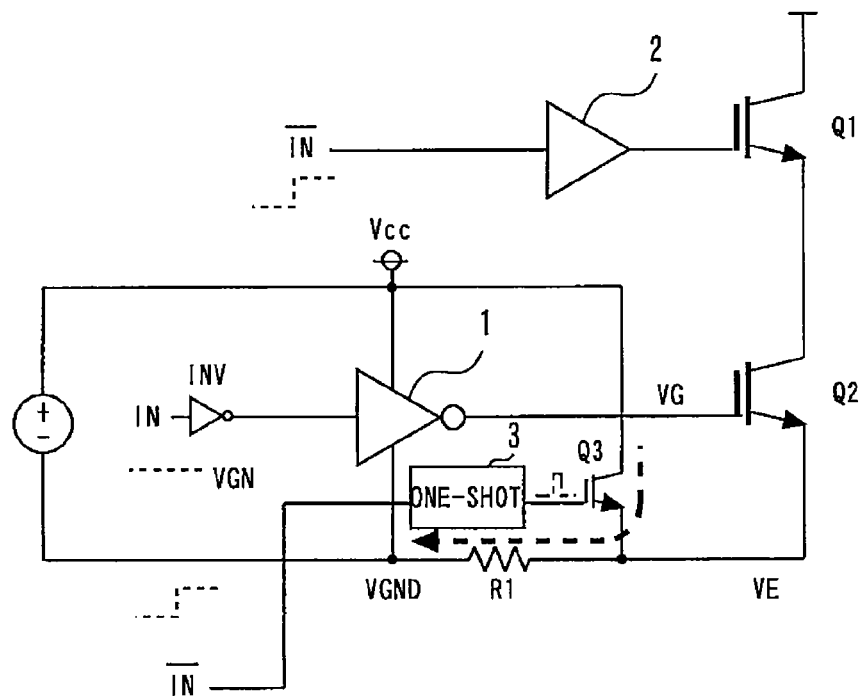
FIG. 8 is a circuit diagram showing a semiconductor device according to the fifth embodiment of the present invention.

FIG. 8 is a circuit diagram showing a semiconductor device according to the fifth embodiment of the present invention. In this semiconductor device, a one-shot circuit 3 is added to the semiconductor device according to the fourth embodiment. The one-shot circuit 3 supplies pulse signals to the gate of the switching element Q3 when the input signals /IN is turned ON. Thereby, the switching element Q3 is turned ON only in a specified period until turn-ON of the power element Q1 is completed. In addition, the period when the switching element Q3 is turned ON is shorter than the period in the second embodiment. As a result, the power consumption of the power source can be significantly reduced.

Sixth Embodiment

Figure 9:
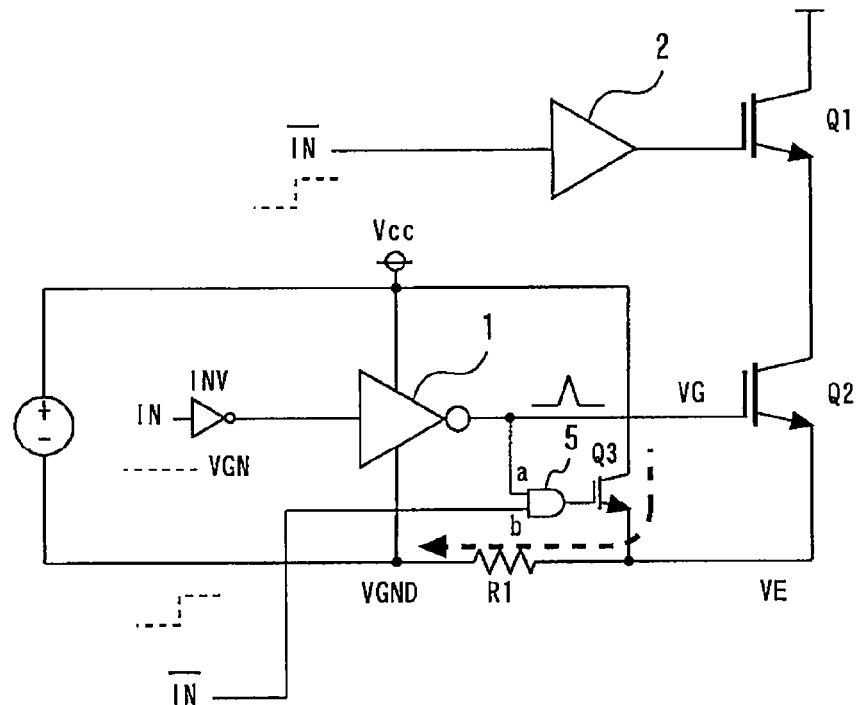
FIG. 9 is a circuit diagram showing a semiconductor device according to the sixth embodiment of the present invention.

FIG. 9 is a circuit diagram showing a semiconductor device according to the sixth embodiment of the present invention. In this semiconductor device, the gate voltage of the power element Q2 is inputted into the a-terminal, and the input signals /IN are inputted to the b-terminal of the AND circuit 5. The AND circuit 5 turns the switching element Q3 ON only when the input signals /IN are ON signals and the voltage VG of the gate of the power element Q2 becomes higher than the voltage VGND of the low-voltage terminal (gate float period). Thereby, the identical effect to that in the third embodiment can be obtained.

Furthermore, since the input signals /IN inputted into the b-terminal of the AND circuit 5 is turned ON delaying for the dead time from the turning OFF of the input signals IN, the delay circuit 4 in the third embodiment is not required.

Seventh Embodiment

Figure 10:
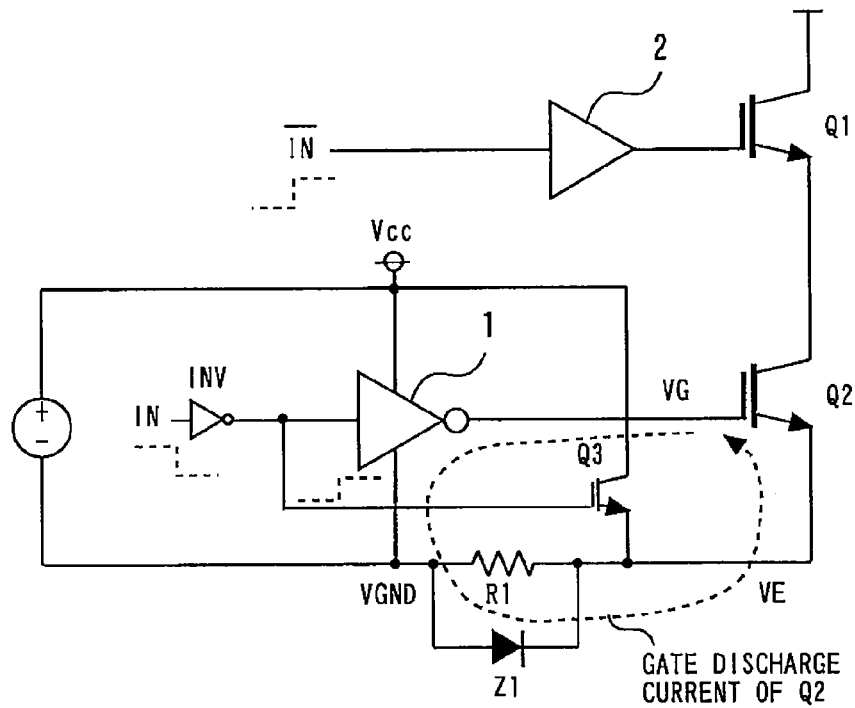
FIG. 10 is a circuit diagram showing a semiconductor device according to the seventh embodiment of the present invention.

FIG. 10 is a circuit diagram showing a semiconductor device according to the seventh embodiment of the present invention. In this semiconductor device, a diode Z1 is connected to the resistor R1 in parallel. Other constitutions are identical to the constitutions in the first embodiment.

In the first embodiment, since the discharge current of the gate of the power element Q2 flows through the resistor R1, the discharging speed becomes low. Whereas in the present embodiment, since the discharge current of the gate of the power element Q2 flows through the diode Z1, the discharging speed becomes high. The identical effect can be obtained when the diode Z1 is added to the constitutions in the second to sixth embodiments.

Eighth Embodiment

Figure 11:
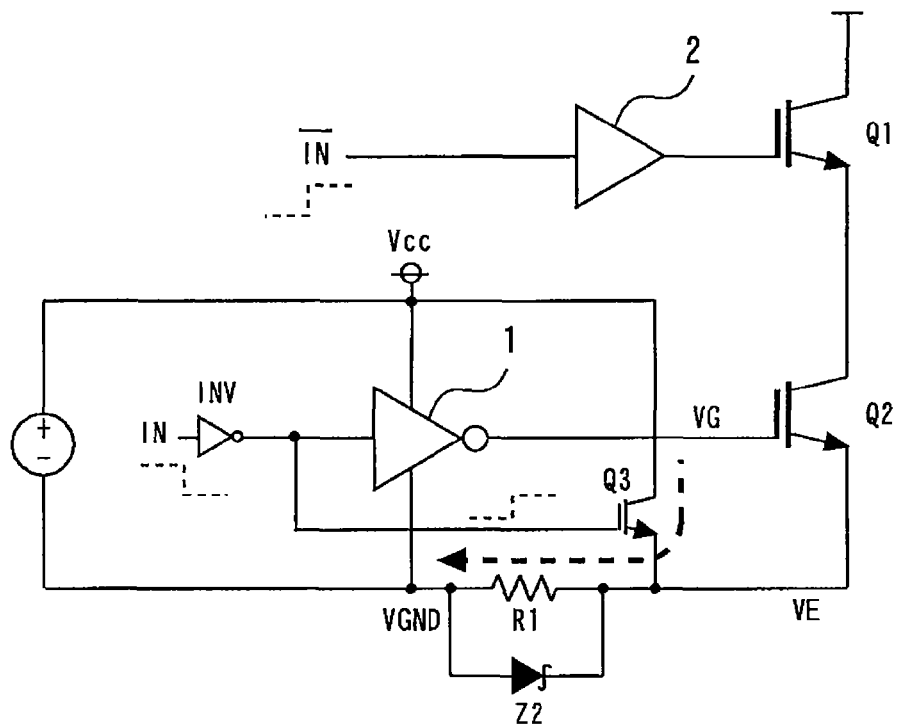
FIG. 11 is a circuit diagram showing a semiconductor device according to the eighth embodiment of the present invention.
Figure 12:
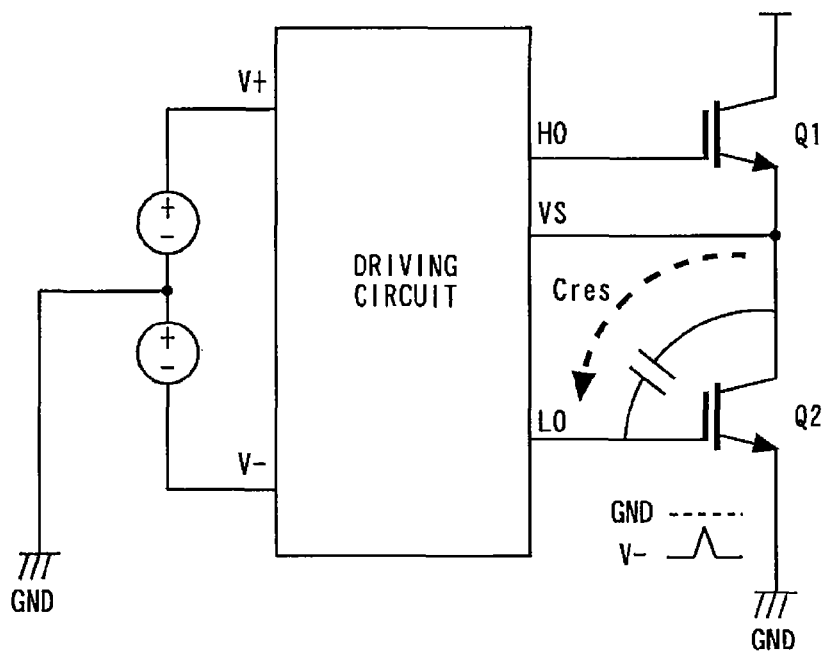
FIG. 12 is a circuit diagram showing a conventional semiconductor device.

FIG. 11 is a circuit diagram showing a semiconductor device according to the eighth embodiment of the present invention. In this semiconductor device, a zener diode Z2 is connected to the resistor R1 in parallel. Other constitutions are identical to the constitutions in the first embodiment. Since the zener diode Z2 clamps negative voltages, excessive negative voltages can be prevented. The identical effect can be obtained when the zener diode Z2 is added to the constitutions in the second to sixth embodiments.

In the above-described first to fifth embodiments, although the cases wherein the gate voltage of the power element Q2 in the N-side is negative voltage were described, the present invention is not limited to this, but can be applied to a case wherein the gate voltage of the power element Q1 in the P-side is negative voltage.

In addition, although the power elements Q1, Q2 and the switching element Q3 are IGBTs (Insulated Gate Bipolar Transistors), the power elements Q1, Q2 and the switching element Q are not limited thereto, and can be power switching elements, such as power MOSFETs (Metal-Oxide-Semiconductor Field-Effect Transistors) and the like.

Furthermore, the power elements Q1, Q2 and the switching element Q3 are not limited to those formed of silicon, but can also be formed of wide band-gap semiconductors having larger band-gap in comparison with silicon. The examples of the wide band-gap semiconductors are silicon carbide, gallium nitride-based materials, or diamond. Since the power semiconductor elements, formed of such wide band-gap semiconductors, have high voltage resistance or allowable current density, their size can be reduced. By using such size-reduced elements, the size of the semiconductor module assembled of these elements can also be reduced. Moreover, since the elements have high heat resistance, the size of the heat releasing fin of the heat sink can be reduced and the water-cooled parts can be air-cooled, the size of the semiconductor module can be further reduced. In addition, since the power loss of the elements is low and the efficiency of the element is high, the efficiency of the semiconductor module can be elevated.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2011-221157, filed on Oct. 5, 2011 including specification, claims, drawings and summary, on which the Convention priority of the present application is based, are incorporated herein by reference in its entirety.

What is claimed is:

1. A semiconductor device comprising:
a first power element having a control terminal, a first terminal, and a second terminal;
a second power element totem-pole-connected to the first power element;
a first driving circuit having a high-voltage terminal connected to a power sauce, and a low-voltage terminal, and driving the first power element corresponding to a first input signal;
a second driving circuit driving the second power element corresponding to a second input signal;
a resistor having a first end connected to the second terminal of the first power element and a second end connected to the low-voltage terminal of the first driving circuit; and
a switching element connected between the high-voltage terminal of the first driving circuit and the first end of the resistor, and turned ON and OFF corresponding to the first input signal or the second input signal,
wherein when the first input signal is an OFF signal, the first driving circuit supplies a voltage of the low-voltage terminal to the control terminal of the first power element and the first power element is turned OFF, and
when the first input signal is an OFF signal or when the second input signal is an ON signal, the switching element is turned ON.

2. The semiconductor device according to claim 1, wherein the switching element is turned ON for only a determined time until turn-ON of the second power element is completed.

3. The semiconductor device according to claim 1, further comprising a control circuit turning the switching element ON only when the first input signal is an OFF signal or the second input signal is an ON signal, and a voltage of the control terminal of the first power element becomes higher than a voltage of the low-voltage terminal.

4. The semiconductor device according to claim 1, further comprising a diode or a zener diode connected to the resistor in parallel.

* * * * *